(12) United States Patent
Shih et al.

(10) Patent No.: US 8,143,904 B2
(45) Date of Patent: Mar. 27, 2012

(54) SYSTEM AND METHOD FOR TESTING AN ELECTROSTATIC CHUCK

(75) Inventors: Hong Shih, Santa Clara, CA (US); Saurabh Ullal, South San Francisco, CA (US); Tuochuan Huang, Saratoga, CA (US); Yan Fang, Fremont, CA (US); Jon McChesney, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 306 days.

(21) Appl. No.: 12/249,215

(22) Filed: Oct. 10, 2008

(65) Prior Publication Data

US 2010/0090711 A1    Apr. 15, 2010

(51) Int. Cl.
*G01R 27/26*    (2006.01)

(52) U.S. Cl. .................................. 324/658; 324/674

(58) Field of Classification Search ............. 324/76.11, 324/457, 658, 674
See application file for complete search history.

(56) References Cited

U.S. PATENT DOCUMENTS

| 2002/0008954 A1* | 1/2002 | Leeser ..................... 361/234 |
| 2003/0033116 A1* | 2/2003 | Brcka et al. ............... 702/182 |
| 2005/0022736 A1 | 2/2005 | Steger |
| 2005/0162175 A1* | 7/2005 | Maeno ...................... 324/750 |

FOREIGN PATENT DOCUMENTS

JP    06198532 A  *  7/1994

* cited by examiner

*Primary Examiner* — Vincent Q Nguyen

(57) ABSTRACT

The present invention provides a reliable, non-invasive, electrical test method for predicting satisfactory performance of electrostatic chucks (ESCs). In accordance with an aspect of the present invention, a parameter, e.g., impedance, of an ESC is measured over a frequency band to generate a parameter functions. This parameter function may be used to establish predetermined acceptable limits of the parameter within the frequency band.

10 Claims, 9 Drawing Sheets

SYSTEM AND METHOD FOR TESTING AN ELECTROSTATIC CHUCK

BACKGROUND

Electrostatic Chucks (ESCs) are essential to precision semiconductor wafer manufacturing process. Existing chucks may be divided into two major categories, each category having its particular strengths and weaknesses.

The dielectric in a Polyimide ESC (PESC) is a strong insulator, consequently, most of the applied voltage drop is across the dielectric and creates a Coulombic chucking force. Unfortunately, the PESC working surface is super-sensitive to scratching. Further, the PESC is susceptible particle embedding, which can cause arcing between the backside of the wafer and the copper electrode on the PESC. Still further, the PESC cannot be used at high temperatures because high temperature operation can cause blisters of water moisture through the polyimide layer.

The partially conducting Ceramic ESCs (CESC) require a constant current to achieve adequate chucking force, thus CESC leakage current is greater, requiring a larger power supply than a PESC. This current-dependent chucking force, known as the Johnsen-Rahbek Effect, is small compared to the Coulombic force in the PESC.

CESCs with anodized aluminum trioxide ($Al_2O_3$), currently available only as monopolar devices, are extremely sensitive to moisture. Further, anodized aluminum has been used as an ESC insulating layer in some bipolar ESCs. However, arcing and anodization defects often cause early failure of this type of ESC.

Doped alumina has been also used for some CESCs for etch applications. The doped ceramic helps to control its resistivity in Johnson-Rahbeck ESC resistivity range. But the grain boundary attack on glass phases can change the surface roughness of the ESC and therefore increase the resistivity. Further, the roughened ceramic surface will cause high helium leak. An attack on the ceramic surface during a waferless auto-clean cycle on ceramic grain boundaries often causes the impedance of the ceramic to move from a Johnson-Rahbeck type impedance to a Coulombic type impedance.

High purity ceramic, e.g., Alumina, has been widely used as the dielectric puck layer on a surface of ESCs. It has been used either as a monopolar or a bipolar ESC. Further, it is used as a Coulombic ESC due to its high resistivity. High purity alumina, e.g., 99.7% purity or higher, may be applied as ESC dielectric puck layer either using a solid sintering ceramic or using a thermal spray coating.

Recently introduced CESCs, employing a sintered Aluminum nitride (AlN) dielectric, have poor thermal transfer characteristics. Resistivity of the ceramic material is temperature-dependent and more variable from piece to piece than the PESC. AlN has a superior thermal conductivity in comparison with alumina. Therefore, it has received wide applications as a high temperature ESC operating at 200° C. or higher. In most cases, AlN surface has mesa surface patterns to control ESC contact area with a wafer surface. The major problem of AlN is that it can generate $AlF_3$ particles when $SF_6$, $NF_3$ and other F-based gases are used in the etching chamber. $AlF_3$ is one the major particle sources in etching chamber technology. Since AlN resistivity depends on the operating temperature as a Johnsen-Rahbek ESC, selection of suitable types of AlN to maintain a workable resistivity and maintaining high plasma-resistance under high density plasma are very important.

Depending on end user requirements and installed equipment, each of the PESC or CESC will satisfactorily hold (Chuck) and release (Dechuck). Generally speaking, it doesn't matter which type of ESC will be used, the capacitance and resistivity of an ESC are the two key parameters for ESC functionality.

FIG. 1 illustrates a planar view of a conventional bipolar electrostatic chuck (ESC) 100. ESC 100 has a top surface 102 and a mounting ledge 104. ESC 100 includes a first electrode 106 and a second electrode 108. First electrode 106 includes an inner electrode portion 110 and an outer electrode portion 112.

FIG. 2 illustrates a cross-sectional view of ESC 100 along line x-x. As illustrated in FIG. 2, ESC 100 includes a rear surface, or base, 114.

Mounting holes (not shown) on mounting ledge 104 enable mounting of ESC 100 onto a system.

In operation, a first voltage differential is applied across first electrode 106 and second electrode 108. The voltage differential creates an electric field, which is used to attract and hold a wafer for processing. When the processing is finished, a second voltage differential (dechucking voltage) is applied across first electrode 106 and second electrode 108 to release the wafer.

Although briefly described above, the voltage control on a conventional ESC, whether single or multi-poled is critical. In this light, many parameters of the ESC that may affect such voltage control are therefore also critical. Non-limiting parameters include resistance, capacitance, impedance and frequency phase shift. Further, the parameters may be further analyzed for each independent portion of the ESC, as opposed to analyzing the parameter of the chuck in its entirety. Non-limiting examples of which include, a specific parameter measured from one electrode to another electrode (pole-to-pole), a specific parameter measured from one electrode on the top surface to the base (pole-to-base).

FIG. 3 illustrates a conventional technique of measuring a parameter of ESC 100. Here, ESC 100 includes measuring terminals 312, 308 and 310, capable of permitting measurement of a characteristic of base 114, first electrode 106 and second electrode 108, respectively. Conventional measuring device 302 includes a first terminal 304 and a second terminal 306. In this example, conventional measuring device 302 may measure a characteristic of ESC 100 between two points. As illustrated, first terminal 304 may be either connected to measuring terminal 312 or measuring terminal 308, whereas second terminal 306 may be either connected to measuring terminal 312 or measuring terminal 310.

In this manner, when first terminal 304 is connected to measuring terminal 308 and when second terminal 306 is connected to measuring terminal 312, a characteristic of first electrode 106 may be measured using a pole-to-base measurement. Similarly, when first terminal 304 is connected to measuring terminal 308 and when second terminal 306 is connected to measuring terminal 310, a characteristic of first electrode 106 and of second electrode 108 may be measured using a pole-to-pole measurement. Similarly, when first terminal 304 is connected to measuring terminal 312 and when second terminal 306 is connected to measuring terminal 310, a characteristic of second electrode 108 may be measured using a pole-to-base measurement.

In the above discussed conventional technique, when conventional measuring device 302 is capable of measuring resistance, the user may measure any one of the resistance of first electrode 106 from pole-to-base, the resistance of second electrode 108 from pole-to-base and the resistance of first electrode 106 and second electrode 108 from pole to pole. Similarly, when conventional measuring device 302 is capable of measuring capacitance, the user may measure any one of the capacitance of first electrode 106 from pole-to-base, the capacitance of second electrode 108 from pole-to-base and the capacitance of first electrode 106 and second electrode 108 from pole to pole. When conventional measuring device 302 is capable of measuring inductance, the user may measure any one of the inductance of first electrode 106 from pole-to-base, the inductance of second electrode 108 from pole-to-base and the inductance of first electrode 106 and second electrode 108 from pole to pole. When conventional measuring device 302 is capable of measuring impedance, the user may measure any one of the impedance of first electrode 106 from pole-to-base, the impedance of second electrode 108 from pole-to-base and the impedance of first electrode 106 and second electrode 108 from pole to pole. When conventional measuring device 302 is capable of measuring a phase delay of the frequency of the applied voltage, the user may measure any one of the phase delay of first electrode 106 from pole-to-base, the phase delay of second electrode 108 from pole-to-base and the phase delay of first electrode 106 and second electrode 108 from pole to pole.

FIGS. 1 and 2 illustrate one type of conventional ESC, and in a very simplistic manner. Many features of the conventional bipolar ESC discussed above have not been shown or described to simplify the discussion. Further, many other types of conventional ESCs have not been specifically described to simplify the discussion. The important notion is that conventional techniques exist to measure specific properties of ESCs and individual portions thereof.

Reliable electrical performance is of the utmost importance. Accordingly, an ESC manufacturer may perform quality assurance checks on manufactured ESC before shipping to customers. One conventional quality assurance check may include determining whether a specific parameter of a manufactured ESC is within a predetermined acceptable range, non-limiting examples of which include: the measured resistance being equal to or greater than $R_1 \Omega$ and equal to or less than $R_2 \Omega$; the measured capacitance being equal to or greater than $c_1 F$ and equal to or less than $c_2 F$; the measured impedance being equal to or greater than $Z_1 \Omega$ and equal to or less than $Z_2 \Omega$; and the measured frequency phase shift being equal to or greater than $\phi_1$ and equal to or less than $\phi_2$. In the conventional methods, the manufacturer applies a current or voltage to the terminals as discussed above at a predetermined frequency $f_m$. If all significant characteristics, e.g., resistance as measured by an Ohmmeter, are within the manufacturer's predetermined range of acceptability, then the ESC is determined to be acceptable.

As an example in TABLE I below, resistance and capacitance measurements were taken on several ESCs (p/n 718-094523-281-E). Capacitance measurements ranged from 3.478 to 3.777 nano Farads and resistance measurements ranged from 2.267 to 3.829 Meg Ohms:

TABLE I

| Device (Ser. No.) | Capacitance (nF) | Resistivity (Megohms) |
| --- | --- | --- |
| D19469 | 3.726 | 3.829 |
| D17303 | 3.777 | 3.244 |
| D18469 | 3.725 | 3.829 |
| D17424 | 3.640 | 2.672 |
| D17697 | 3.478 | 2.267 |

Note, these devices were deemed acceptable by the manufacturer. How close the first device tested was to exceeding the maximum allowable resistance, or the second was to having too little resistance hasn't been defined.

An ESC's performance will degrade with use. If visual inspection clearly indicates ESC defects (cracked, deep scratches, residual particles) immediate replacement may be in order. It is difficult to isolate the cause when an ESC fails to perform satisfactorily, because of the sensitivity and complexity of the process control system. The present state of the art does not provide a simple non-invasive means of detecting non-visual defects. Conventional characteristic tests, for example, duplicating the manufacturer's acceptance tests, as discussed above, may indicate that a particular ESC is acceptable even though the ESC does not perform satisfactorily.

What is needed is a reliable, non-invasive method to determine the suitability of an ESC for initial or for continued use.

BRIEF SUMMARY

It is an object of the present invention to provide a reliable, non-invasive, electrical test method for predicting satisfactory performance of ESCs, both for initial acceptance and for in-service use.

In accordance with an aspect of the present invention, a method is used to test an ESC having a front surface and a back surface and comprising a first electrode and a second electrode. The method comprises establishing predetermined acceptable limits of a parameter of the ESC within a frequency band, and measuring the parameter of the ESC within the frequency band.

In accordance with another aspect of the present invention, a method is used to establish acceptable limits of a parameter of an electrostatic chuck using a known upper limit of the parameter at a single frequency and a known lower limit of the parameter at the single frequency. The method comprises measuring the parameter of the electrostatic chuck within a frequency band to obtain a function of the parameter within the frequency band, generating a slope of the function of the parameter within the frequency band, generating an acceptable upper limit of the parameter using the known upper limit of the parameter at the single frequency and the slope of the function of the parameter, and generating an acceptable lower limit of the parameter using the known lower limit of the parameter at the single frequency and the slope of the function of the parameter.

In accordance with an aspect of the present invention, a method is used to establish acceptable limits of a parameter of an electrostatic chuck using a known upper limit of the parameter at a single frequency and a known lower limit of the parameter at the single frequency. The method comprises measuring the parameter of the electrostatic chuck within a frequency band a plurality of times to obtain a corresponding plurality of functions of the parameter within the frequency band, generating a mean function of the parameter based on the plurality of functions, generating a predetermined number of standard deviations of the parameter based on the plurality of functions, generating an acceptable upper limit of the parameter and an acceptable lower limit of the parameter using the predetermined number of standard deviations of the parameter.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

Aspects of the present invention will now be described with reference to FIGS. 4-15.

Figure 1:
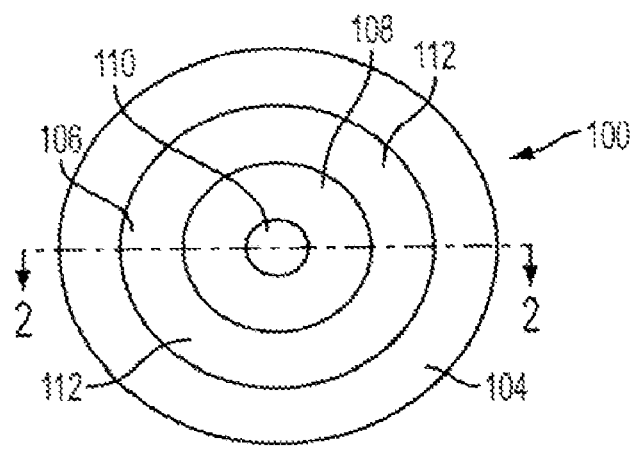
FIG. 1 illustrates a planar view of a conventional bipolar ESC.
Figure 2:
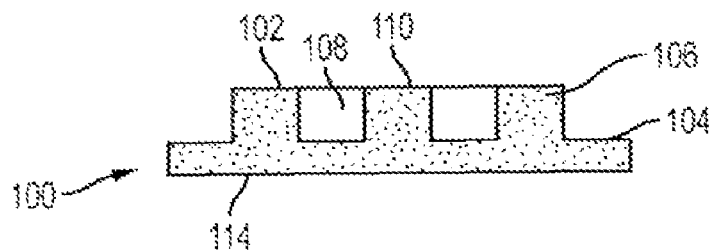
FIG. 2 is a cross-sectional view of the conventional bipolar ESC of FIG. 1.
Figure 3:
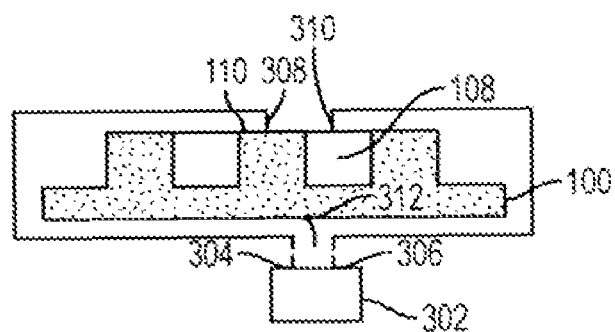
FIG. 3 illustrates a conventional technique of measuring a parameter of ESC.
Figure 4:
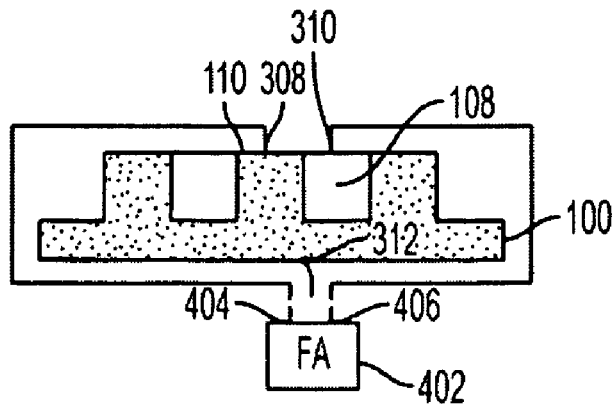
FIG. 4 illustrates an exemplary technique of measuring a parameter of ESC in accordance with an aspect of the present invention.

FIG. 4 illustrates an exemplary technique of measuring a parameter of ESC 100 in accordance with the present invention. The method of FIG. 4 differs from the method of FIG. 3 in that the method of FIG. 4 includes a frequency response analyzer 402 in place of the conventional measuring device 302 of FIG. 3. Frequency response analyzer 402 includes a first terminal 404 and a second terminal 406. In this example, frequency response analyzer 402 may measure a characteristic of ESC 100 at two points. As illustrated, first terminal 404 may be either connected to measuring terminal 312 or measuring terminal 308, whereas second terminal 406 may be either connected to measuring terminal 312 or measuring terminal 310.

In this manner, when first terminal 404 is connected to measuring terminal 308 and when second terminal 406 is connected to measuring terminal 312, a characteristic of first electrode 106 may be measured using a pole-to-base measurement. Similarly, when first terminal 404 is connected to measuring terminal 308 and when second terminal 406 is connected to measuring terminal 310, a characteristic of first electrode 106 and of second electrode 108 may be measured using a pole-to-pole measurement. Similarly, when first terminal 404 is connected to measuring terminal 312 and when second terminal 406 is connected to measuring terminal 310, a characteristic of second electrode 108 may be measured using a pole-to-base measurement.

As distinct from the conventional measuring device 302 of the method illustrated in FIG. 3, in accordance with the present invention, frequency response analyzer 402 measures a characteristic over a frequency band. On other words, in the conventional methods, any particular characteristic—whether it be impedance, resistance, capacitance, etc., and whether it be measured from pole-to-pole, base-to-base, surface, etc.—was measured at a single frequency. In accordance with embodiments of the present invention, any particular characteristic may be measured over a frequency band. This will be described in more detail below with respect to FIG. 5.

Figure 5:
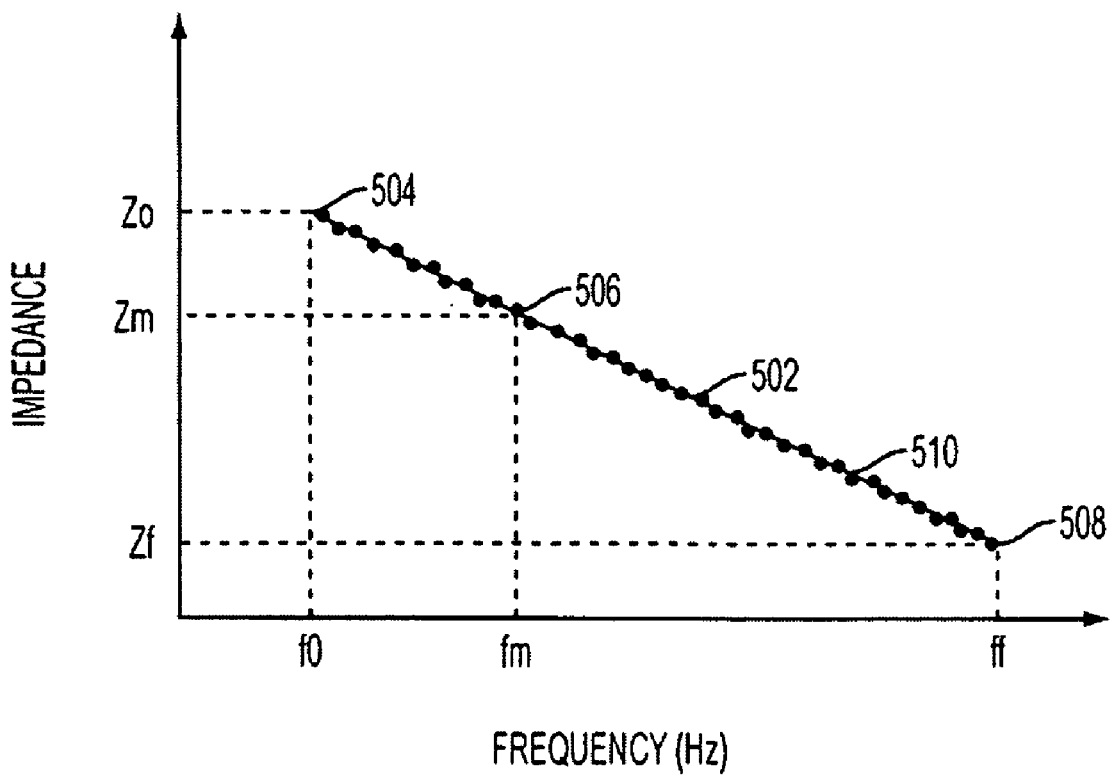
FIG. 5 is a graph of an exemplary impedance as a function of frequency of ESC.

FIG. 5 is a graph of an exemplary impedance as a function of frequency of ESC 100 as measured from measuring terminal 310 to measuring terminal 312 using frequency response analyzer 402. As illustrated in the graph, frequency response analyzer 402 measures impedance within a predetermined band having a lowest frequency $f_0$ and a maximum frequency $f_f$. The particular band may be determined by the user, and may include frequencies in which ESC 100 will likely be used. Further, frequency response analyzer 402 measures impedance at points 502 within the band ($f_0$, $f_f$) at sampling intervals. Points 502 include an initial impedance $Z_o$ at point 504 corresponding to initial frequency $f_0$, an impedance $Z_m$ at point 506 corresponding to frequency $f_m$, and a final impedance $Z_f$ at point 508 corresponding to final frequency $f_f$. Point 506 corresponds to the frequency $f_m$ at which the manufacturer may have measured impedance in accordance with the conventional methods described above with reference to FIG. 3.

Points 502 may be used to fit a line 510, which may be considered the impendence function of a "good" working ESC. Practically speaking, not all ESCs will have the same impedance function, yet may nevertheless be considered acceptable. There are many ways to establish acceptable boundaries for ESCs in accordance with the present invention.

Figure 6:
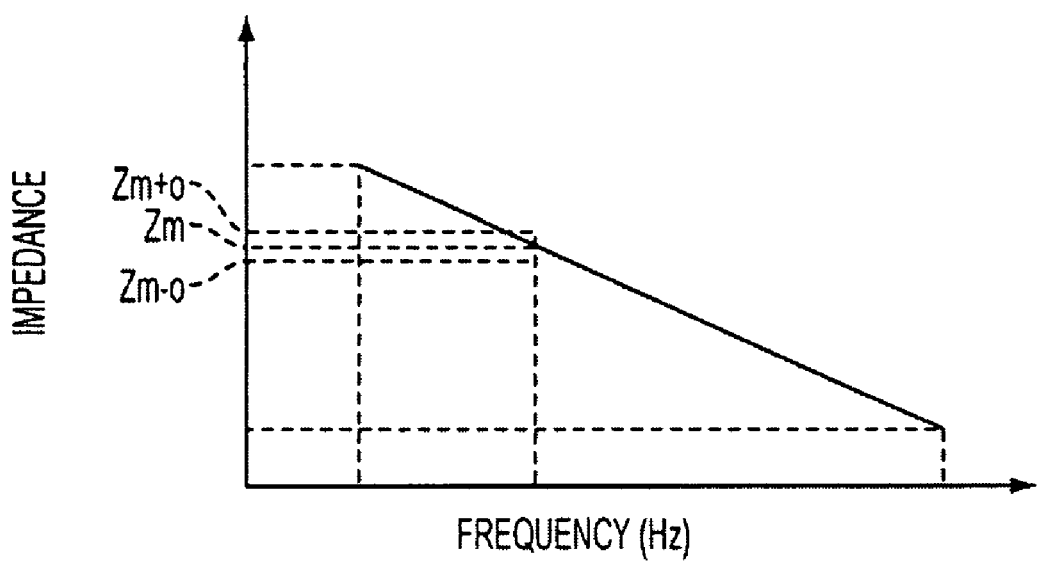
FIG. 6 represents manufacturer's chosen tolerances for a measured parameter at a manufacturer's frequency.
Figure 7:
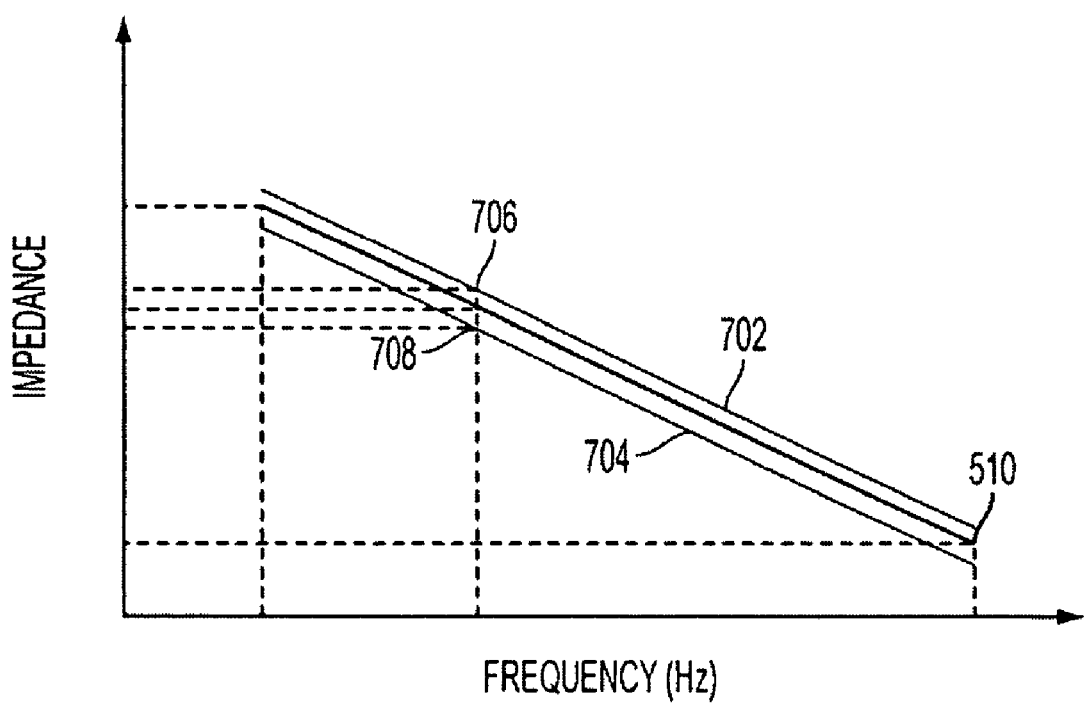
FIG. 7 represents an exemplary method of establishing tolerances for a measured parameter over a frequency band in accordance with an aspect of the present invention.

In one method of establishing acceptable boundaries for a parameter of ESCs in accordance with the present invention, a manufacturer may indicate that an ESC is considered acceptable if a measureable parameter is within an acceptable range. For example, as illustrated in FIG. 6, a manufacturer may allow a predetermined deviation ±σ about impedance $Z_m$, which of course was measured only at frequency $f_m$. In accordance with the present invention, this manufacturer's predetermined acceptable deviation ±σ about impedance $Z_m$ may be used to generate acceptable impedance functions. One exemplary manner includes using the manufacturer's predetermined acceptable deviation ±σ about impedance $Z_m$ in conjunction with the slope of line 510. As seen in FIG. 7, line 702 is generated using an impedance of $Z_{m+\sigma}$ at frequency $f_m$ with the slope of line 510. Similarly, line 704 is generated using an impedance of $Z_{m-\sigma}$ at frequency $f_m$ with the slope of line 510. As such, line 702 will be the upper boundary of an acceptable impedance function of an ESC as measured from measuring terminal 310 to measuring terminal 312, whereas line 704 will be the lower boundary of an acceptable impedance function of an ESC as measured from measuring terminal 310 to measuring terminal 312.

In the embodiment discussed above, with respect to FIG. 5, the slope of line 510 is linear. In other working examples, the slope may not be linear. As such, one method of obtaining the slope includes taking the derivative of the function of the measured parameter.

Figure 8:
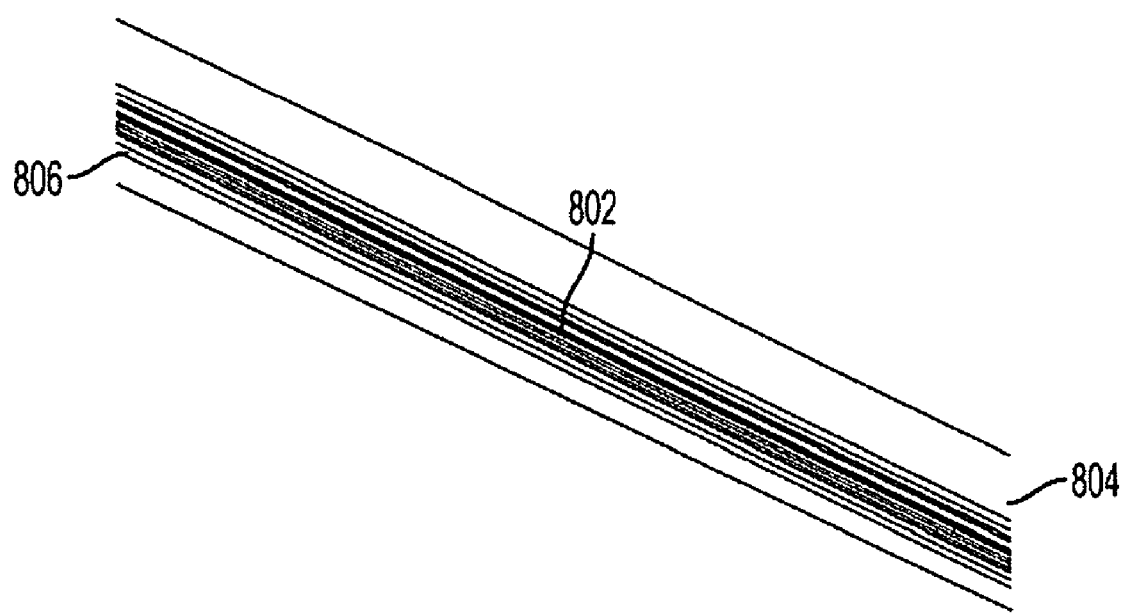
FIG. 8 illustrates a plurality of measured impedances as a function of frequency of a corresponding plurality of ESCs.

Another method of establishing acceptable boundaries for a parameter of ESCs in accordance with the present invention includes taking measurements from a plurality ESCs that are known to be acceptable. FIG. 8, for example, illustrates this method. In the figure, a portion 802 of line 510 is bounded above by plurality of lines 804 and bounded below by plurality of lines 806. Plurality of lines 804 correspond to impedance functions of a plurality of ESCs that are known to be acceptable yet have a somewhat higher impedance that the ESC corresponding to line 510, whereas plurality of lines 806 correspond to impedance functions of a plurality of ESCs that are known to be acceptable yet have a somewhat lower impedance that the ESC corresponding to line 510.

Figure 9:
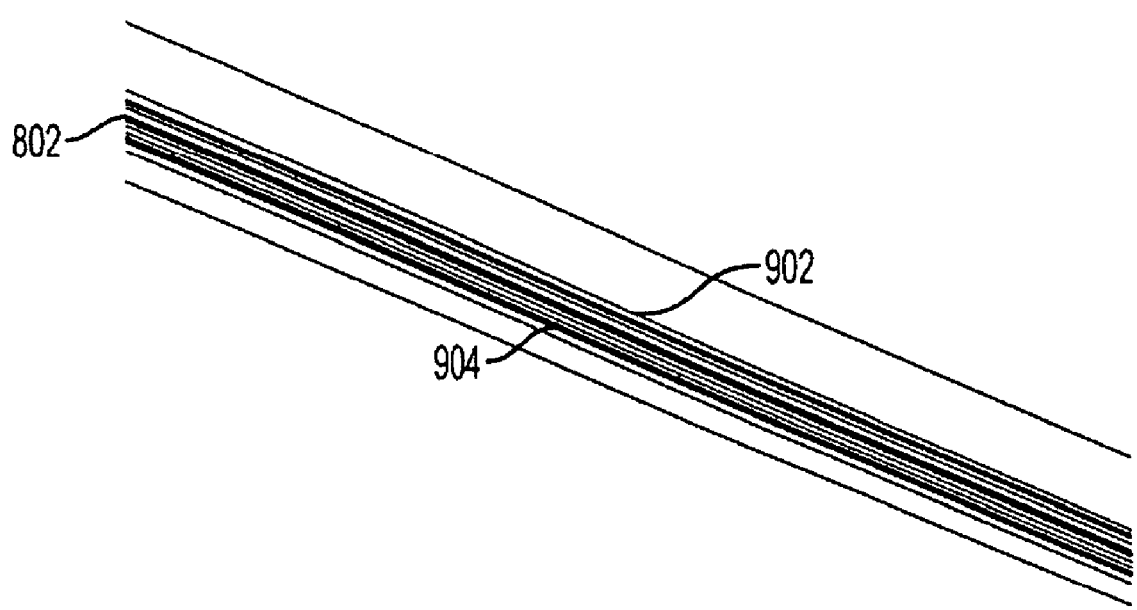
FIG. 9 represents another exemplary method of establishing tolerances for a measured parameter over a frequency band in accordance with an aspect of the present invention.

Line 802, plurality of lines 804 and plurality of lines 806 may then be used to generate acceptable boundaries of impedance functions via a mean impedance function in addition to a standard deviation. For example, as illustrated in FIG. 9, upper boundary 902 and lower boundary 904 are created using a predetermined standard deviation of line 802, plurality of lines 804 and plurality of lines 806. In this example, assume that line 510 is the mean function of plurality of lines 804 and plurality of lines 806. As such, line 902 will be the upper boundary of an acceptable impedance function of an ESC as measured from measuring terminal 310 to measuring terminal 312, whereas line 904 will be the lower boundary of an acceptable impedance function of an ESC as measured from measuring terminal 310 to measuring terminal 312.

Once acceptable boundaries for a parameter of ESCs are established, an ESC, whether new or used, may be tested in accordance with an aspect of the present invention to determine if it remains acceptable. An exemplary method of testing an ESC for acceptability will now be described with reference to FIG. 10.

Figure 10:
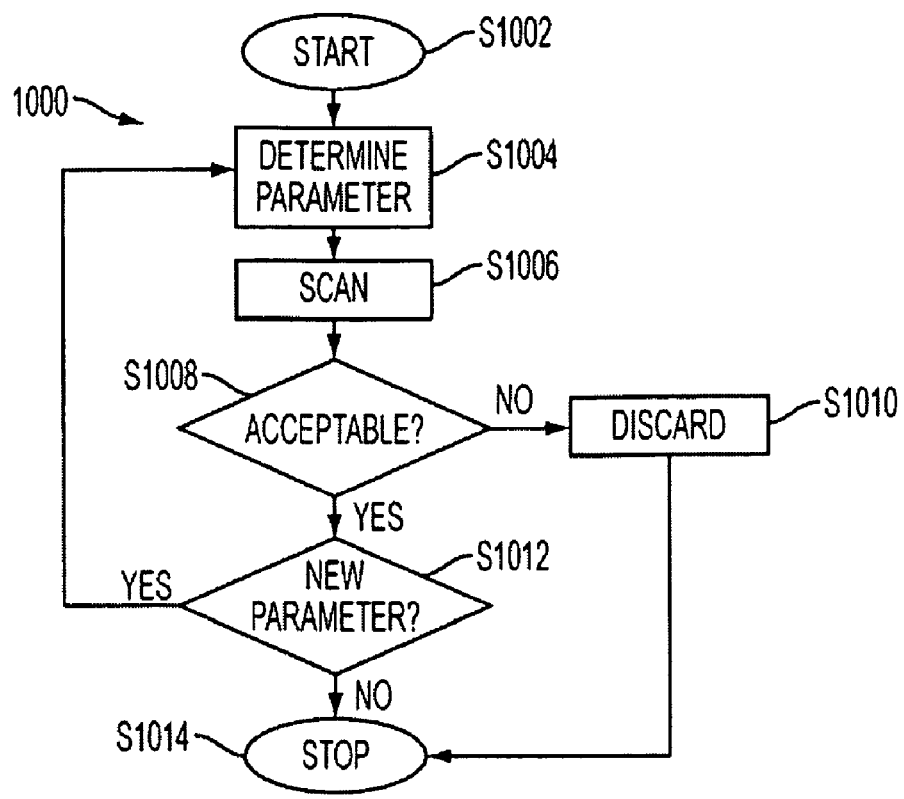
FIG. 10 is the flow diagram illustrating an exemplary method of testing an ESC in accordance with an aspect of the present invention.

FIG. 10 is a logic flow diagram of an exemplary process of testing an ESC for acceptability in accordance with the present invention. As illustrated in the figure, process 1000 starts (S1002) and a parameter is determined to be measured (S1004). For purposes of discussion, assume that the parameter to be measured is impedance as measured from measuring terminal 310 of a used ESC to measuring terminal 312 of the used ESC using frequency response analyzer 402.

Figure 11:
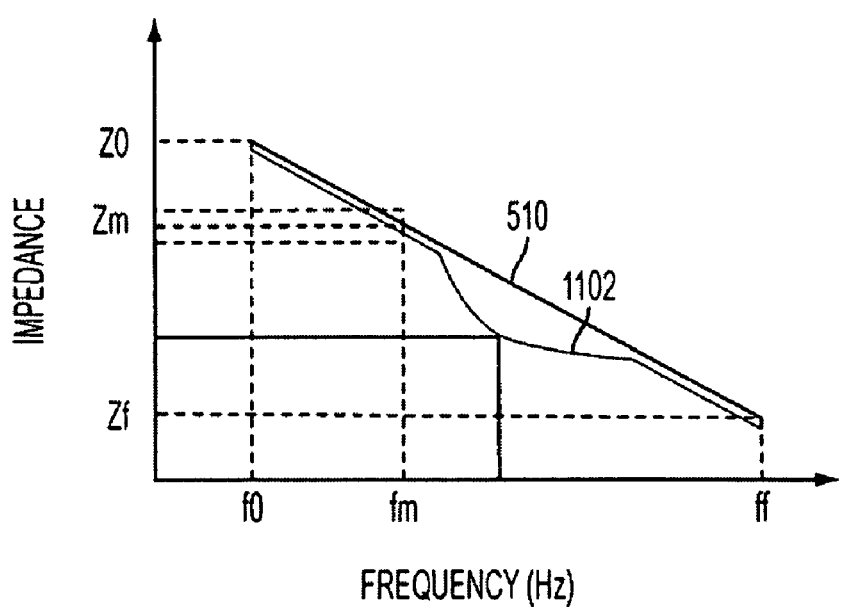
FIG. 11 is a graph of two measured impedance functions of two corresponding ESCs.
Figure 12:
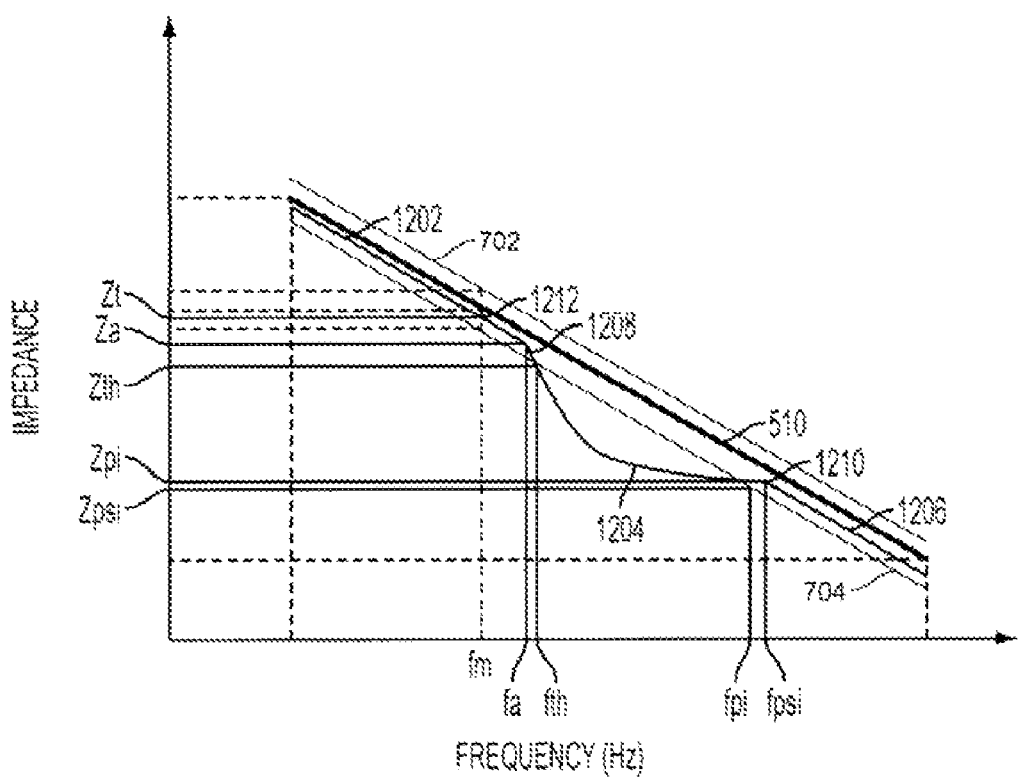
FIG. 12 is the graph of FIG. 11, having established acceptable upper and lower boundaries with respect to a measured impedance function superimposed thereon.

Once the parameter to be measured is determined, frequency response analyzer 402 scans a predetermined frequency band (S1006) and measures the corresponding impedances. FIG. 11 shows a graph of a measured impedance function from a used ESC as compared to an impedance function of ESC 100, which in this example is known to be acceptable. As illustrated in the figure, the measured impedance function 1102 of used ESC is distinct from line 510, the measured impedance function of ESC 100. Similar to FIG. 5 discussed above, frequency response analyzer 402 measures impedance within a predetermined band having an initial frequency $f_0$ and a final frequency $f_f$. Distinctions between measured impedance function 1102 and measured impedance function 510 will now be described with reference to FIG. 12.

Similar to FIG. 7 discussed above, FIG. 12 includes established acceptable upper and lower boundaries with respect to a measured impedance function. Specifically, line 702 is the upper boundary of an acceptable impedance function of an ESC as measured from measuring terminal 310 to measuring terminal 312, whereas line 704 is the lower boundary of an acceptable impedance function of an ESC as measured from measuring terminal 310 to measuring terminal 312.

In the present example, measured impedance function 1102 includes a first portion 1202, a second portion 1204 and a third portion 1206. Both first portion 1202 and third portion 1206 are disposed within lines 702 and 704 and may therefore be considered acceptable. Portion 1204 however is disposed below line 704 and therefore would be considered unacceptable. Further the slope of portion 1204 is dramatically different from the slope of line 510 and therefore would be considered unacceptable.

A portion 1208, which spans from the impedance $Z_\alpha$ as measured at frequency $f_\alpha$ to the impedance $Z_\theta$ as measured at frequency $f_\theta$, of portion 1202 lies with lines 702 and 704, but has a dramatically different slope than that of line 510. Similarly, portion 1210, which spans from the impedance $Z_\phi$ as measured at frequency $f_\phi$ to the impedance $Z_\psi$ as measured at frequency $f_\psi$, of portion 1206 has a dramatically different slope than that of line 510. As such, although the measured impedance within portions 1208 and 1210 may be acceptable, the rate of change of impedance within the corresponding frequency bands may raise concern as to suitability.

Returning back to FIG. 10, once the parameter is measured, in the present example, the impedance function of an ESC as measured from measuring terminal 310 to measuring terminal 312, it is determined whether the ESC is acceptable (S1008). It should be noted that in accordance with the conventional technique, if the ESC of FIG. 12 was measured at the manufacturer's test frequency $f_m$, then the corresponding measured impedance $Z_t$ at point 1212 on line 1102 would indicate that the ESC is acceptable. However, in accordance with the present invention, one might conclude that the ESC is unacceptable in light of the slope of line 1102 at portions 1204, 1208 and 1210 being substantially different from the slope of acceptable ESC 100 having line 510. Further, one might conclude that ESC is unacceptable in light of portion 1204 being below line 704.

Deviations in magnitude of a measured parameter or deviations in the rate of change of the measured parameter over a frequency band may indicate any one of a plurality of problems or potential problems, non-limiting examples of which include: an integrity breakdown in at least one part of the ESC; stress, which may lead to an integrity breakdown, in at least one part of the ESC. Further, in accordance with the present invention, a user may determine that a particular ESC that is tested, is not acceptable within a specific frequency band but is acceptable in other frequency bands. For example, returning to FIG. 12, a user may determine that the tested ESC is acceptable from frequency $f_0$ frequency $f_\alpha$ and from frequency $f_\phi$ to frequency $f_f$. As such, as opposed to discarding the tested ESC, it may be used in a more restricted manner.

Returning to FIG. 10, if the tested ESC is determined to be unacceptable, it is discarded (S1010). If the tested ESC is determined to be acceptable, then the user may wish to make further tests for other parameters (S1012).

The above discussed exemplary embodiments of the present invention with reference to FIGS. 4-12 are drawn to a bipolar ESC wherein the parameter measured is impedance as measured from measuring terminal 310 to measuring terminal 312. Of course other parameters may be measured.

Figure 13:
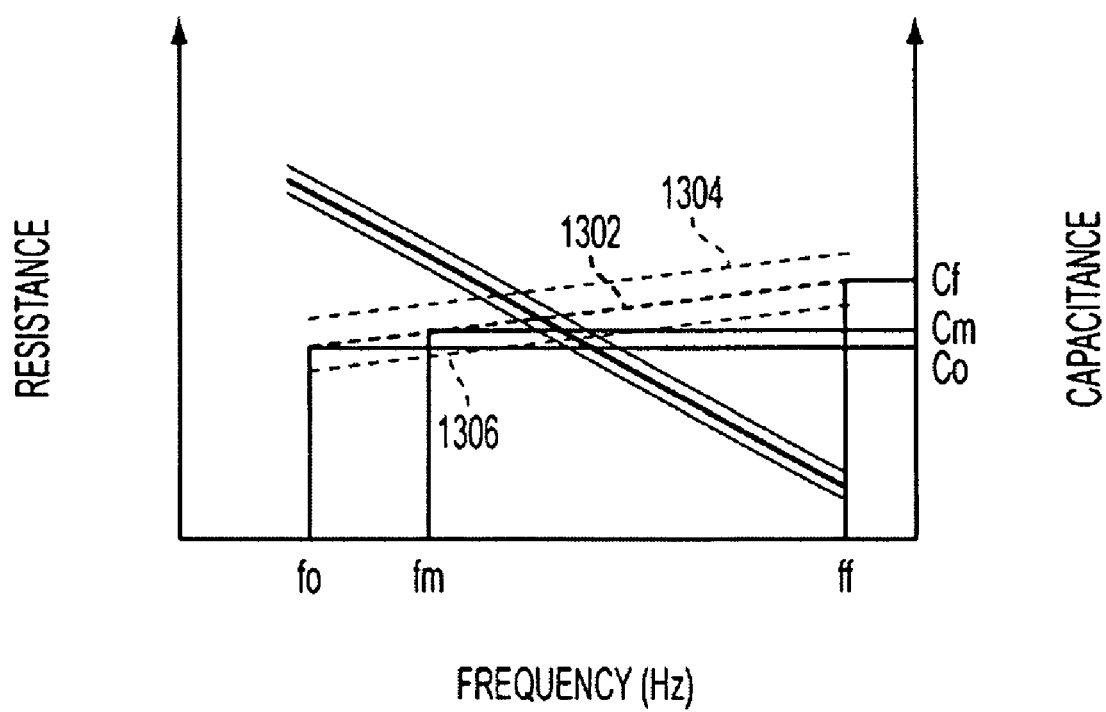
FIG. 13 is a graph having the impedance function of FIG. 5 in addition to an exemplary measured capacitance function, in accordance with an aspect of the present invention.

FIG. 13 shows a graph having the impedance function of FIG. 7 in addition to a capacitance function 1302. The capacitance of ESC 100 is displayed as measured from measuring terminal 310 to measuring terminal 312, and as measured from initial frequency $f_0$ to final frequency $f_f$. The figure additionally illustrates an acceptable upper boundary 1304 for the capacitance function and an acceptable lower boundary 1306 of the capacitance function. As discussed above in the previous embodiments with reference to impedance, these acceptable boundaries may be determined in many ways.

Returning to FIG. 10, if an new parameter is to be measured (S1004), for example capacitance as illustrated in FIG. 13, then the measured capacitance function is compared with the acceptable upper boundary 1304 and the acceptable lower boundary 1306, in a manner similar to that described above with reference to impedance.

Figure 14:
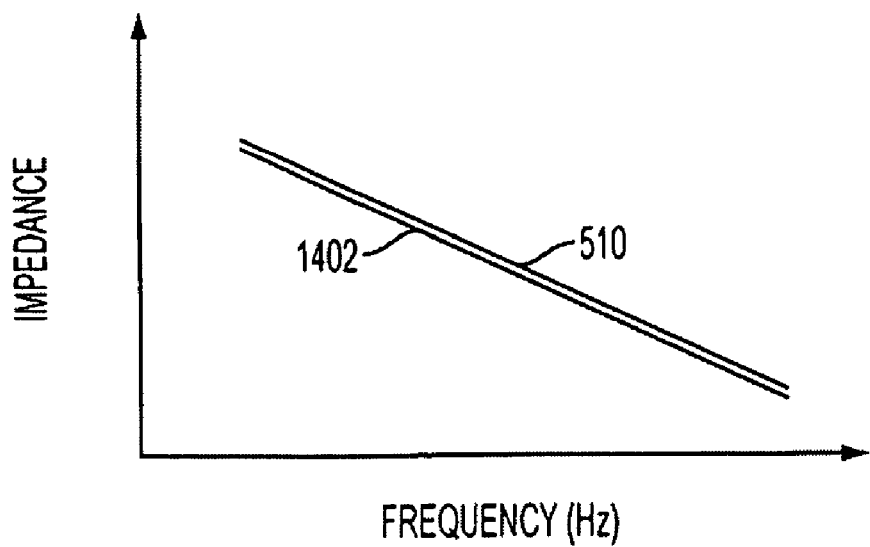
FIG. 14 is a graph having the impedance function of FIG. 5 in addition to an exemplary measured impedance function, in accordance with an aspect of the present invention.

In other embodiments, the "other parameter" of step S1012 of FIG. 10 may be a new measurement from different ports on the ESC. For example, another parameter may be impedance as measured from measuring terminal 310 to measuring terminal 308. As such, the new measurement will be a pole-to-pole impedance. FIG. 14 illustrates line 510 and a line 1402 corresponding to the impedance of ESC 100 as measured from measuring terminal 310 to measuring terminal 312, and as measured from initial frequency $f_0$ to final frequency $f_f$. In this example, the impedance slope for lines 510 and 1402 are similar, yet the magnitude of the impedance of line 1402 is slightly lower than the magnitude of the impedance of line 510.

Figure 15:
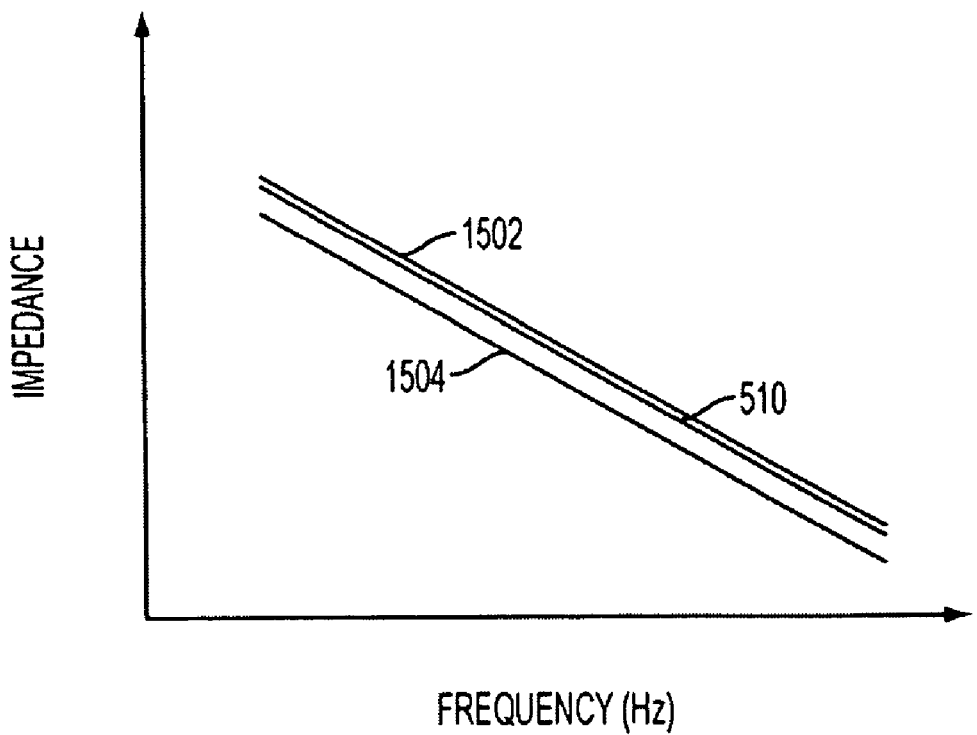
FIG. 15 is a graph having the impedance function of FIG. 5 in addition to exemplary measured impedance functions as measured at different temperatures, in accordance with an aspect of the present invention.

In other embodiments, the "other parameter" of step S1012 of FIG. 10 may be a new measurement of the same parameter, from the same ports on the ESC, but in a different ambient temperature. FIG. 15 illustrates line 510, line 1502 and line 1504. Line 510 corresponds to the impedance of ESC 100 as measured from measuring terminal 310 to measuring terminal 312, and as measured from initial frequency $f_0$ to final frequency $f_f$, and as measured from a first temperature $t_0$. Line 1502 corresponds to the impedance of ESC 100 as measured from measuring terminal 310 to measuring terminal 312, and as measured from initial frequency $f_0$ to final frequency $f_f$, and as measured from a second temperature $t_h$, wherein $t_h > t_0$. Line 1504 corresponds to the impedance of ESC 100 as measured from measuring terminal 310 to measuring terminal 312, and as measured from initial frequency $f_0$ to final frequency $f_f$, and as measured from a third temperature $t_l$, wherein $t_0 > t_l$.

As discussed earlier, and ESC manipulates electric fields to chuck, hold and de-chuck wafers for processing. Therefore, capacitance of an ESC is a particularly important parameter to monitor and maintain. In a specific working example, capacitance is determined by measuring impedance via a frequency response analyzer, as will be discussed in more detail below.

Figure 16:
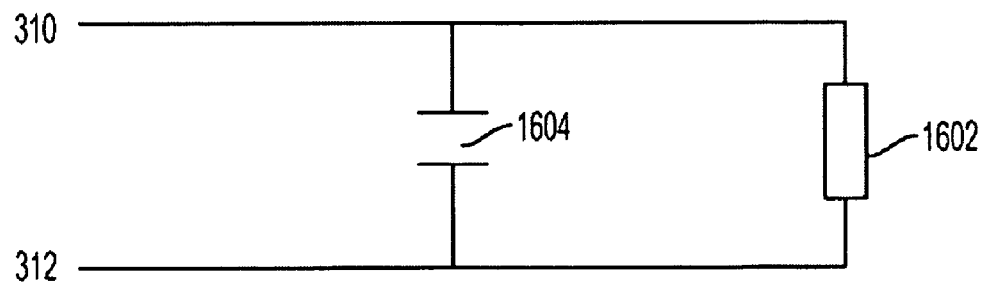
FIG. 16 is a schematic representation of an ESC as a RC circuit.

ESC 100, for example as measured from measuring terminal 310 to measuring terminal 312, may be schematically illustrated as a parallel RC circuit as illustrated in FIG. 16. In the figure, resistor 1602 corresponds to the overall resistance between measuring terminal 310 and measuring terminal 312 whereas capacitor 1604 corresponds to the overall capacitance between measuring terminal 310 and measuring terminal 312. Because resistor 1602 is in parallel with capacitor 1604 the overall impedance Z of ESC 100, as measured from measuring terminal 310 to measuring terminal 312, may be derived from basic circuit theory as:

$$Z = \frac{RX_c^2}{R^2 + X_c^2} - \frac{jR^2 X_c}{R^2 + X_c^2}$$

where $$X_c = 1/(\omega C), \text{ and}$$

where Xc is die capacitive resistance as measured in Ohms, $\omega$ is the driving frequency of the input signal, C is the capacitance as measured in Farads and R is the resistance as measured in Ohms.

By using the known impedance function discussed above, and by measuring the impedance of ESC 100, for example as measured from measuring terminal 310 to measuring terminal 312, with frequency response analyzer 402, the capacitance C and resistance R of ESC 100 may be determined.

With known upper and lower limits on acceptability of capacitance and resistance, for example having previously been determined by any of the example methods discussed above, then a measured impedance of ESC 100 may be used to determine whether ESC 100 is acceptable based on its resistance and capacitance. For example, a Bode plot based on the measured impedance will readily determine whether ESC 100 is acceptable.

Figure 17:
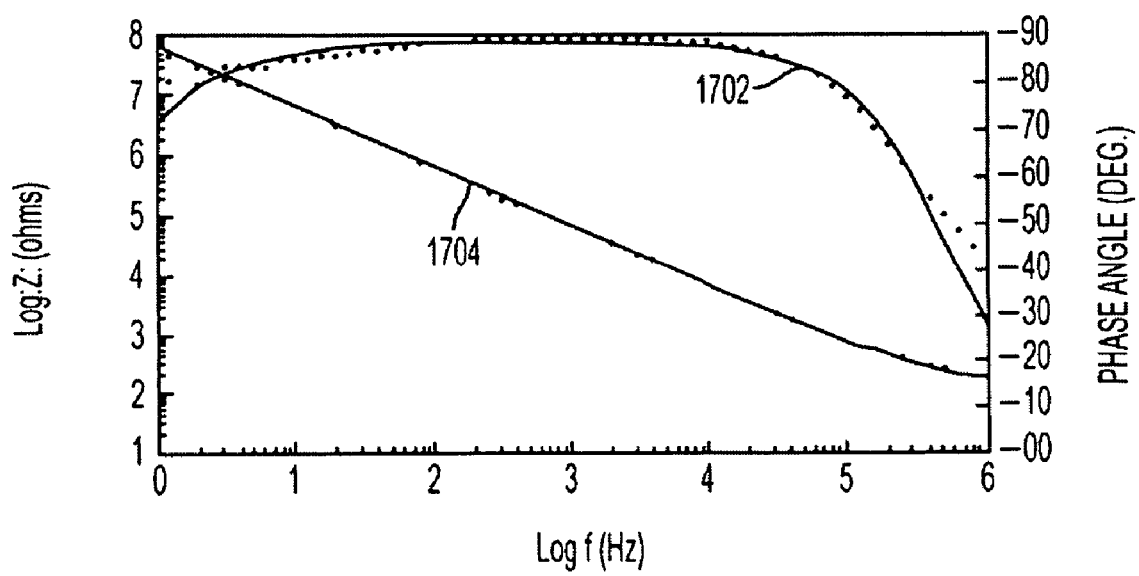
FIG. 17 is a graph showing resistance and phase shift as a function of the log of the frequency.

FIG. 17 is an exemplary graph showing a Bode phase plot 1702 and a resistance plot 1704 on a log-frequency axis. Bode phase plot 1702 illustrates how much a frequency is phase-shifted, which is calculated based on the imaginary and real portions of impedance discussed above. It should be noted that the Bode phase plot 1702 maintains a steady slope between log 2 and log 4 on the graph. As such, the capacitance varies little throughout these frequencies, which indicates that ESC 100 should maintain steady chucking, holding and de-chucking operations.

The above discussed exemplary embodiment include testing of a bipolar ESC. Of course any type of ESC may be tested in accordance with the present invention. Further, any number of measurable parameters, any number of measurements from different measuring ports or sites, and any number of temperatures for measurements of an ESC may be used to determine acceptability in accordance with the present invention.

To tailor the method for a specific wafer production facility, accept-reject criteria may be developed for each different type/model/series of ESC used at that facility, based on the installation's equipment configuration, the test equipment selected, and applicable proprietary processes. Before placing new ESCs in service, each ESC may be tested and its initial, benchmark, measurements recorded. Subsequently, each time an ESC is tested, the measurements would be added to its record, until it fails the acceptance criteria for resistance, capacitance or any other controlled parameter, or is withdrawn from service for other reasons, e.g. unacceptable visible defects.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of testing an electrostatic chuck having a front surface and a back surface and comprising at least one electrode, said method comprising:

establishing predetermined acceptable limits of a parameter of the electrostatic chuck within a frequency band; and measuring, between the back surface and one of the at least one electrode, the parameter of the electrostatic chuck within the frequency band.

2. The method of claim 1, wherein said measuring a first parameter of the electrostatic chuck comprises measuring resistance.

3. The method of claim 2,
wherein the at least one electrode comprises a first electrode and a second electrode, and
wherein said measuring a resistance comprises measuring a resistance between the first electrode and the second electrode.

4. The method of claim 1, wherein said measuring a first parameter of the electrostatic chuck comprises measuring capacitance.

5. The method of claim 4,
wherein the at least one electrode comprises a first electrode and a second electrode, and
wherein said measuring a capacitance comprises measuring a capacitance between the first electrode and the second electrode.

6. The method of claim 1, wherein said measuring a first parameter of the electrostatic chuck comprises measuring impedance.

7. The method of claim 6,
wherein the at least one electrode comprises a first electrode and a second electrode, and
wherein said measuring an impedance comprises measuring an impedance between the first electrode and the second electrode.

8. The method of claim 1, wherein said measuring the parameter of the electrostatic chuck within the frequency band comprises measuring the parameter of the electrostatic chuck within the frequency band at a first temperature and measuring the parameter of the electrostatic chuck within the frequency band at a second temperature.

9. The method of claim 1, wherein said measuring a first parameter of the electrostatic chuck comprises measuring at least one of resistance, capacitance and impedance.

10. The method of claim 9, wherein said measuring the parameter of the electrostatic chuck within the frequency band comprises measuring the parameter of the electrostatic chuck within the frequency band at a first temperature and measuring the parameter of the electrostatic chuck within the frequency band at a second temperature.

* * * * *